(12) United States Patent
Sargent et al.

(10) Patent No.: US 7,326,908 B2
(45) Date of Patent: Feb. 5, 2008

(54) OPTICALLY-REGULATED OPTICAL EMISSION USING COLLOIDAL QUANTUM DOT NANOCRYSTALS

(75) Inventors: Edward Sargent, 1206-400 Walmer Road, Toronto (CA) M5P 2X7; Lioudmila Bakoueva, Mississauga (CA); Sergei Musikhin, St. Petersburg (RU)

(73) Assignee: Edward Sargent, Toronto (CA)

( * ) Notice: Subject to any disclaimer, the term of this patent is extended or adjusted under 35 U.S.C. 154(b) by 188 days.

(21) Appl. No.: 11/108,900

(22) Filed: Apr. 19, 2005

(65) Prior Publication Data
US 2005/0236556 A1 Oct. 27, 2005

Related U.S. Application Data

(60) Provisional application No. 60/563,012, filed on Apr. 19, 2004.

(51) Int. Cl.
*H01L 31/00* (2006.01)
(52) U.S. Cl. ............ 250/214.1; 977/774; 977/954
(58) Field of Classification Search ............ 250/214.1; 257/E29.071; 438/962; 977/774, 954
See application file for complete search history.

(56) References Cited

U.S. PATENT DOCUMENTS

| | | |
|---|---|---|
| 3,962,141 A | 6/1976 | Inoue et al. |
| 3,968,360 A | 7/1976 | Monnier |
| 4,002,902 A | 1/1977 | Donjon et al. |
| 4,117,329 A | 9/1978 | Kruer et al. |
| 4,183,748 A | 1/1980 | Murai et al. |
| 4,888,521 A | 12/1989 | Tanioka et al. |

(Continued)

FOREIGN PATENT DOCUMENTS

KR 10-2004-0091898 11/2004

(Continued)

OTHER PUBLICATIONS

Bakueva, et al., "Luminescence and Photovoltaic Effects in Polymer-Based Nanocomposites", *Handbook of Organic-Inorganic Hybrid Materials and Nanocomposites*, vol. 2, Chapter 5, pp. 181-215 (2003).

(Continued)

*Primary Examiner*—John R. Lee
(74) *Attorney, Agent, or Firm*—Courtney Staniford & Gregory LLP

(57) ABSTRACT

The present invention relates to the emission of light which occurs in proportion with an electrical signal, an optical signal, or the combination of both. The emission of light may occur due to the passage of current through a light-emitting polymer, or due to energy transfer of excitons from this polymer to light-emitting quantum dots. Optical sensitivity is achieved through the inclusion of another species of quantum dots whose absorption is generally at longer wavelengths relative to the light-emitting material. Light incident upon the device results in an enhanced current flow in the presence of an applied bias, and thus enhanced excitation of the light-emitting moity is achieved in proportion with the optical power absorbed by the light-absorbing moity. Two device architectures are presented, one based on a mutilayer structure in which the functions of light absorption and light emission are separated, and the other in which these functions are integrated within a single active region.

71 Claims, 2 Drawing Sheets

U.S. PATENT DOCUMENTS

| | | |
|---|---|---|
| 4,948,741 A | 8/1990 | Hammond et al. |
| 4,952,839 A | 8/1990 | Tanioka et al. |
| 5,014,069 A | 5/1991 | Seiler et al. |
| 5,124,545 A | 6/1992 | Takanashi et al. |
| 5,130,826 A | 7/1992 | Takanashi et al. |
| 5,233,265 A | 8/1993 | Takasaki et al. |
| 5,260,957 A | 11/1993 | Hakimi et al. |
| 5,262,357 A | 11/1993 | Alivisatos et al. |
| 5,294,992 A | 3/1994 | Konno et al. |
| 5,299,042 A | 3/1994 | Takanashi et al. |
| 5,350,915 A | 9/1994 | Ishihara et al. |
| RE34,947 E | 5/1995 | Takanashi et al. |
| 5,438,198 A | 8/1995 | Ebitani et al. |
| 5,500,188 A | 3/1996 | Hafeman et al. |
| 5,505,928 A | 4/1996 | Alivisatos et al. |
| 5,537,000 A | 7/1996 | Alivisatos et al. |
| 5,591,962 A | 1/1997 | Koishi et al. |
| 5,614,708 A | 3/1997 | Koishi et al. |
| 5,703,436 A | 12/1997 | Forrest et al. |
| 5,751,018 A | 5/1998 | Alivisatos et al. |
| 5,818,053 A | 10/1998 | Tran |
| 5,834,893 A | 11/1998 | Bulovic et al. |
| 5,844,253 A | 12/1998 | Kim et al. |
| 5,923,028 A | 7/1999 | Turnbull et al. |
| 5,923,953 A | 7/1999 | Goldenberg Barany et al. |
| 5,929,689 A | 7/1999 | Wall |
| 5,953,587 A | 9/1999 | Forrest et al. |
| 5,986,268 A | 11/1999 | Forrest et al. |
| 5,990,479 A | 11/1999 | Weiss et al. |
| 5,998,803 A | 12/1999 | Forrest et al. |
| 6,005,252 A | 12/1999 | Forrest et al. |
| 6,046,543 A | 4/2000 | Bulovic et al. |
| 6,064,054 A | 5/2000 | Waczynski et al. |
| 6,107,630 A | 8/2000 | Mazurowski et al. |
| 6,111,902 A | 8/2000 | Kozlov et al. |
| 6,160,828 A | 12/2000 | Kozlov et al. |
| 6,198,091 B1 | 3/2001 | Forrest et al. |
| 6,198,092 B1 | 3/2001 | Bulovic et al. |
| 6,207,229 B1 | 3/2001 | Bawendi et al. |
| 6,207,392 B1 | 3/2001 | Weiss et al. |
| 6,210,814 B1 | 4/2001 | Thompson et al. |
| 6,214,631 B1 | 4/2001 | Burrows et al. |
| 6,225,198 B1 | 5/2001 | Alivisatos et al. |
| 6,239,449 B1 | 5/2001 | Fafard et al. |
| 6,251,303 B1 | 6/2001 | Bawendi et al. |
| 6,264,805 B1 | 7/2001 | Forrest et al. |
| 6,278,055 B1 | 8/2001 | Forrest et al. |
| 6,287,712 B1 | 9/2001 | Bulovic et al. |
| 6,297,495 B1 | 10/2001 | Bulovic et al. |
| 6,297,516 B1 | 10/2001 | Forrest et al. |
| 6,306,610 B1 | 10/2001 | Bawendi et al. |
| 6,306,736 B1 | 10/2001 | Alivisatos et al. |
| 6,312,836 B1 | 11/2001 | Bulovic et al. |
| 6,319,426 B1 | 11/2001 | Bawendi et al. |
| 6,322,901 B1 | 11/2001 | Bawendi et al. |
| 6,326,144 B1 | 12/2001 | Bawendi et al. |
| 6,333,458 B1 | 12/2001 | Forrest et al. |
| 6,342,325 B1 | 1/2002 | Suda et al. |
| 6,352,777 B1 | 3/2002 | Bulovic et al. |
| 6,396,860 B1 | 5/2002 | Kozlov et al. |
| 6,403,392 B1 | 6/2002 | Burrows et al. |
| 6,407,408 B1 | 6/2002 | Zhou et al. |
| 6,423,551 B1 | 7/2002 | Weiss et al. |
| 6,423,980 B1 | 7/2002 | Wilson et al. |
| 6,426,513 B1 | 7/2002 | Bawendi et al. |
| 6,440,213 B1 | 8/2002 | Alivisatos et al. |
| 6,440,769 B2 | 8/2002 | Peumans et al. |
| 6,444,143 B2 | 9/2002 | Bawendi et al. |
| 6,451,415 B1 | 9/2002 | Forrest et al. |
| 6,458,426 B1 | 10/2002 | Bulovic et al. |
| 6,501,091 B1 | 12/2002 | Bawendi et al. |
| 6,509,066 B1 | 1/2003 | Jost |
| 6,538,801 B2 | 3/2003 | Jacobson et al. |
| 6,548,316 B1 | 4/2003 | Tam et al. |
| 6,548,956 B2 | 4/2003 | Forrest et al. |
| 6,576,291 B2 | 6/2003 | Bawendi et al. |
| 6,596,134 B2 | 7/2003 | Forrest et al. |
| 6,602,671 B1 | 8/2003 | Bawendi et al. |
| 6,605,806 B2 | 8/2003 | Walmsley et al. |
| 6,607,829 B1 | 8/2003 | Bawendi et al. |
| 6,617,583 B1 | 9/2003 | Bawendi et al. |
| 6,670,544 B2 | 12/2003 | Kibbel et al. |
| 6,690,012 B1 | 2/2004 | Jacksen et al. |
| 6,692,820 B2 | 2/2004 | Forrest et al. |
| 6,696,299 B1 | 2/2004 | Empedocles et al. |
| 6,699,723 B1 | 3/2004 | Weiss et al. |
| 6,710,366 B1 | 3/2004 | Lee et al. |
| 6,727,065 B2 | 4/2004 | Weiss et al. |
| 6,730,914 B2 | 5/2004 | Chao et al. |
| 6,743,516 B2 | 6/2004 | Murphy et al. |
| 6,774,361 B2 | 8/2004 | Bawendi et al. |
| 6,781,868 B2 | 8/2004 | Bulovic et al. |
| 6,791,130 B2 | 9/2004 | Chao et al. |
| 6,798,033 B2 | 9/2004 | Chao et al. |
| 6,803,719 B1 | 10/2004 | Miller et al. |
| 6,809,358 B2 | 10/2004 | Hsieh et al. |
| 6,809,955 B2 | 10/2004 | Bulovic et al. |
| 6,819,692 B2 | 11/2004 | Klimov et al. |
| 6,821,337 B2 | 11/2004 | Bawendi et al. |
| 6,844,025 B2 | 1/2005 | Forrest et al. |
| 6,844,608 B2 | 1/2005 | Bulovic et al. |
| 6,853,013 B2 * | 2/2005 | Hirai et al. .................. 257/103 |
| 6,855,202 B2 | 2/2005 | Alivisatos et al. |
| 6,855,551 B2 | 2/2005 | Bawendi et al. |
| 6,861,155 B2 | 3/2005 | Bawendi et al. |
| 6,864,626 B1 | 3/2005 | Weiss et al. |
| 6,878,871 B2 | 4/2005 | Scher et al. |
| 6,884,478 B2 | 4/2005 | Alivisatos et al. |
| 6,890,777 B2 | 5/2005 | Bawendi et al. |
| 6,900,458 B2 | 5/2005 | Tung et al. |
| 6,914,265 B2 | 7/2005 | Bawendi et al. |
| 6,917,055 B2 | 7/2005 | Stegmuller et al. |
| 6,918,946 B2 * | 7/2005 | Korgel et al. .................. 75/362 |
| 6,921,496 B2 | 7/2005 | Anderson et al. |
| 6,927,069 B2 | 8/2005 | Weiss et al. |
| 6,939,604 B1 | 9/2005 | Guyot-Sionnest et al. |
| 6,984,369 B1 | 1/2006 | Alivisatos et al. |
| 7,012,363 B2 | 3/2006 | Weaver et al. |
| 7,026,041 B2 | 4/2006 | Forrest et al. |
| 7,042,003 B2 * | 5/2006 | Jang et al. .................... 257/21 |
| 7,045,956 B2 * | 5/2006 | Braune et al. .............. 313/512 |
| 7,049,148 B2 | 5/2006 | Bawendi et al. |
| 7,060,243 B2 | 6/2006 | Bawendi et al. |
| 7,132,787 B2 * | 11/2006 | Ozkan et al. ................ 313/503 |
| 2001/0000005 A1 | 3/2001 | Forrest et al. |
| 2001/0011551 A1 | 8/2001 | Peumans et al. |
| 2001/0023078 A1 | 9/2001 | Bawendi et al. |
| 2001/0040232 A1 | 11/2001 | Bawendi et al. |
| 2001/0046244 A1 | 11/2001 | Klimov et al. |
| 2002/0071952 A1 | 6/2002 | Bawendi et al. |
| 2002/0072234 A1 | 6/2002 | Weiss et al. |
| 2002/0110180 A1 | 8/2002 | Barney et al. |
| 2002/0119297 A1 | 8/2002 | Forrest et al. |
| 2002/0153243 A1 | 10/2002 | Forrest et al. |
| 2002/0160412 A1 | 10/2002 | Bawendi et al. |
| 2002/0163057 A1 | 11/2002 | Bulovic et al. |
| 2002/0163829 A1 | 11/2002 | Bulovic et al. |
| 2002/0163830 A1 | 11/2002 | Bulovic et al. |
| 2002/0182632 A1 | 12/2002 | Anderson et al. |
| 2002/0197462 A1 | 12/2002 | Forrest et al. |
| 2003/0099968 A1 | 5/2003 | Weiss et al. |
| 2003/0100130 A1 | 5/2003 | Weiss et al. |
| 2003/0113709 A1 | 6/2003 | Alivisatos et al. |
| 2003/0127659 A1 | 7/2003 | Bawendi et al. |

| | | |
|---|---|---|
| 2003/0127660 A1 | 7/2003 | Bawendi et al. |
| 2003/0127973 A1 | 7/2003 | Weaver et al. |
| 2003/0136943 A1 | 7/2003 | Alivisatos et al. |
| 2003/0142944 A1 | 7/2003 | Sundar et al. |
| 2003/0145779 A1 | 8/2003 | Alivisatos et al. |
| 2003/0209105 A1 | 11/2003 | Bawendi et al. |
| 2003/0213967 A1 | 11/2003 | Forrest et al. |
| 2003/0226498 A1 | 12/2003 | Alivisatos et al. |
| 2004/0004982 A1 | 1/2004 | Eisler et al. |
| 2004/0017834 A1 | 1/2004 | Sundar et al. |
| 2004/0023010 A1* | 2/2004 | Bulovic et al. ............. 428/209 |
| 2004/0031965 A1 | 2/2004 | Forrest et al. |
| 2004/0031966 A1 | 2/2004 | Forrest et al. |
| 2004/0033359 A1 | 2/2004 | Bawendi et al. |
| 2004/0038310 A1 | 2/2004 | Bawendi et al. |
| 2004/0091710 A1 | 5/2004 | Bawendi et al. |
| 2004/0094757 A1* | 5/2004 | Braune et al. ............... 257/13 |
| 2004/0110002 A1 | 6/2004 | Kim et al. |
| 2004/0151887 A1 | 8/2004 | Forrest et al. |
| 2004/0164292 A1 | 8/2004 | Tung et al. |
| 2004/0191915 A1 | 9/2004 | Bawendi et al. |
| 2004/0217298 A1 | 11/2004 | Bawendi et al. |
| 2004/0259363 A1 | 12/2004 | Bawendi et al. |
| 2005/0002635 A1 | 1/2005 | Banin et al. |
| 2005/0020922 A1 | 1/2005 | Frangioni et al. |
| 2005/0020923 A1 | 1/2005 | Frangioni et al. |
| 2005/0031888 A1 | 2/2005 | Bawendi et al. |
| 2005/0048283 A1 | 3/2005 | Bawendi et al. |
| 2005/0054004 A1 | 3/2005 | Alivisatos et al. |
| 2005/0061363 A1 | 3/2005 | Ginley et al. |
| 2005/0072989 A1 | 4/2005 | Bawendi et al. |
| 2005/0084443 A1 | 4/2005 | Bawendi et al. |
| 2005/0088380 A1 | 4/2005 | Bulovic et al. |
| 2005/0109269 A1 | 5/2005 | Alivisatos et al. |
| 2005/0112849 A1 | 5/2005 | Stott et al. |
| 2005/0116256 A1 | 6/2005 | Bulovic et al. |
| 2005/0118631 A1 | 6/2005 | Bawendi et al. |
| 2005/0120946 A1 | 6/2005 | Hines et al. |
| 2005/0133087 A1 | 6/2005 | Alivisatos et al. |
| 2005/0136232 A1 | 6/2005 | Forrest et al. |
| 2005/0146258 A1 | 7/2005 | Weiss et al. |
| 2005/0196894 A1* | 9/2005 | Maa et al. .................... 438/93 |
| 2005/0202615 A1 | 9/2005 | Duan et al. |
| 2005/0211154 A1 | 9/2005 | Alivisatos et al. |
| 2005/0224531 A1 | 10/2005 | Bulovic |
| 2005/0227373 A1 | 10/2005 | Flandre et al. |
| 2005/0230673 A1* | 10/2005 | Mueller et al. ............... 257/13 |
| 2005/0258418 A1 | 11/2005 | Steckel et al. |
| 2005/0287717 A1 | 12/2005 | Heald et al. |
| 2006/0003464 A1 | 1/2006 | Weiss et al. |
| 2006/0019098 A1 | 1/2006 | Chan et al. |
| 2006/0057637 A1 | 3/2006 | Anderson et al. |
| 2006/0060862 A1 | 3/2006 | Bawendi et al. |
| 2006/0068154 A1 | 3/2006 | Parce et al. |
| 2006/0073607 A1 | 4/2006 | Rose et al. |
| 2006/0076036 A1 | 4/2006 | Whitefield et al. |
| 2006/0097247 A1* | 5/2006 | Kim et al. .................... 257/40 |
| 2006/0114960 A1 | 6/2006 | Snee et al. |
| 2006/0115585 A1 | 6/2006 | Bulovic et al. |
| 2006/0157720 A1 | 7/2006 | Bawendi et al. |
| 2006/0159901 A1 | 7/2006 | Tischler et al. |
| 2006/0170331 A1* | 8/2006 | Bertram et al. ............. 313/498 |
| 2006/0176485 A1 | 8/2006 | Bulovic et al. |
| 2006/0177945 A1 | 8/2006 | Weiss et al. |
| 2006/0182970 A1 | 8/2006 | Bawendi et al. |
| 2006/0243959 A1* | 11/2006 | Sargent et al. ................ 257/12 |

FOREIGN PATENT DOCUMENTS

| | | |
|---|---|---|
| WO | WO-93/15525 | 5/1993 |
| WO | WO-2005/101530 A1 | 10/2005 |
| WO | WO-2006/072181 A1 | 7/2006 |

OTHER PUBLICATIONS

Bakueva, L. et al., "Size-Tunable Infrared (1000-1600nm) Electroluminescence from PbS Quantum-Dot Nanocrystals in a Semiconducting Polymer", Applied Physics Letters, vol. 82, pp. 2895-2897 (2003).

Brabec, et al., "A Low-Bandgap Semiconducting Polymer for Photovoltaic Devices and Infrared Diodes", Adv. Funct., Mater., 12:709-712 (2002).

Brabec, et al., "Origin of the Open Circuit Voltage of Plastic Solar Cells", Adv. Funct. Mater., 11:374-380 (2001).

Breeze, et al., "The Effects of Processing Conditions on Polymer Photovoltaic Device Performance", *Proceedings of SPIE*, Kafafi, et al., eds., 5215:271 (2004).

Coe, et al., "Electroluminescence from single monolayers of nanocrystals in molecular organic devices", Nature, vol. 420, pp. 800-803, Dec. 19/26, 2002.

Dabbousi, et al., "Electroluminescence from CdSe Quantum-Dot/ Polymer Composites", Appl. Phys. Lett., 66:1316-1318 (1995).

Drees, et al., "Enhanced Photovoltaic Efficiency in Polymer-Fullerene Composites by Thermally Controlled Interdiffusion", *Proceedings of SPIE*, Kafafi, et al., eds, 5215:89 (2004).

Drndic, et al., "Transport Properties of Annealed CdSe Colloidal Nanocrystal Solids", Appl. Phys., 92:7498 (2002).

Ettenberg, M., "A little night vision", Advanced Imaging, vol. 20, pp. 29-32 (2005).

Forrest, "The Path to Ubiquitos and Low-Cost Organic Electronic Appliances on Plastic", Nature, 428:911-918 (2004).

Gadisa, et al., "Correlation Between Oxidation Potential and Open-Circuit Voltage of Composite Solar Cells Based on Blends of Polythiophenes/Fullerene Derivative", Appl. Phys. Lett., 84:1609 (2004).

Ginger, et al., "Charge Injection and Transport in Films of CdSe Nanocrystals", J. Appl. Phys., 87:1361-1368 (2000).

Greczynski, et al., "Energy Level Alignment in Organic-Based Three-Layer Structures Studied by Photoelectron Spectroscopy", J. Appl. Phys., 88:7187-7191 (2000).

Greenham, et al. "Charge Separation and Transport in Conjugated-Polymer/Semiconductor-Nanocrystal Composites Studied by Photoluminescence Quenching and Photoconductivity", Phys. Rev., B 54:17628-17637 (1996).

Greenwald, et al., "Polymer-Polymer Rectifying Heterojunction Based on Poly(3,4-dicyanothiophene) and MEH-PPV", J. Polym. Sci. A: Polym. Chem., 36:3115-3120 (1998).

Handbook of Conducting Polymers, Skotheim, ed., Dekker, New York (1986).

Handbook of Organic-Inorganic Hybrid Materials and Nanocomposites, Nalva, ed., American Scientific Publishers (2003).

Henckens, et al., "Poly(thienulene vinylene) Derivatives As Low Band Gap Polymers for Photovoltaic Applications", Thin Sol. Films., 572-579 (2004).

Hines, et al., "Colloidal PbS Nanocrystals with Size-Tunable Near-Infrared Emission: Observation of Post-Synthesis Self-Narrowing of the Particle Size Distribution", Advanced Materials, vol. 15, pp. 1844-1849 (Nov. 2003).

Huynh, et al., "Hybrid Nanorod-Polymer Solar Cells", Science, 295:2425-2427 (2002).

Huynh, et al., "Controlling the Morphology of Nanocrystal-Polymer Composites for Solar Cells", Adv. Funct. Mater., 13:73-79 (2003).

Huynh, et al., "CdSe Nanocrystal Rods/Poly (3-hexylthiophene) Composite Photovoltaic Devices", Adv. Mater., vol. 11, No. 11, pp. 923-927 (1999).

Jin, et al., "Synthesis and Characterization of Highly Luminescent Asymmetric Poly(p-phenylene vinylene) Derivatives for Light-Emitting Diodes", Chem. Mater., 14:643-650 (2002).

Kilimov, Semiconductor and Metal Nanocrystals: Synthesis and Electronic and Optical Properties, Chapter 5, Marcel Dekker, Inc., New York (2004).

Kim, S. et al., "Near-infrared fluorescent type II quantum dots for sentinel lymph node mapping", Nature Biotechnology, vol. 22, pp. 93-97 (2004).

Kippelen, et al., "Organic Photovoltaics Based on Self-Assembled Mesophases", NCPV and Solar Program Review Meeting, NREL/CD-520-33586, p. 431 (2003).

Koetse, et al., "The Influence of the Polymer Architecture on Morphology and Device Properties of Polymer Bulk Heterojunction Photovoltaic Cells", *Proceedings of SPIE*, Kafafi, et al., eds., 5215:119 (2004).

Konstantatos, G. et al., "Ultrasensitive solution-case quantum dot photodetectors", Nature, vol. 442, pp. 180-183 (2006).

Lee, et al., "Luminescent Spectral Changes in Polymer Light-Emitting Diodes after Heat Treatments", Molec. Cryst. and Liq. Cryst., vol. 349, pp. 451-454 (2000).

Lim, Y. et al., "Selection of quantum dot wavelengths for biomedical assays and imaging", Molecular Imaging, vol. 2, pp. 50-64 (2003).

Mattoussi, et al., "Electroluminescence from Heterostructures of Poly(phenylene vinylene) and Inorganic CdSe Nanocrystals", J. Appl. Phys., 83:7965-7947 (1998).

McDonald, et al., "Photoconductivity from PbS-Nanocrystal/Semiconducting Polymer Composites for Solution-Processable, Quantum-Size Tunable Infrared Photodetectors", Appl. Phys. Lett., 85:2089-2091 (2004).

McDonald, S. et al., "Solution-processed PbS quantum dot infrared photodetectors and photovoltaics", Nature Materials, vol. 4, pp. 138-142 (Jan. 9, 2005).

Murray, et al., "Synthesis and Characterization of Nearly Monodisperse CdE (E=S, Se, Te) Semiconductor Nanocrystallites", J. Amer. Chem. Soc., vol. 115, pp. 8706-8715 (1993).

Nguyen, et al., "Improving the Performance of Conjugated Polymer-Based Devices by Control of Interchain Interactions and Polymer Film Morphology", Appl. Phys. Lett., 76:2454-2456 (2000).

Nguyen, et al., "Controlling Interchain Interactions in Conjugated Polymers: The Effects of Chain Morphology on Exciton-Exciton Annihilation and Aggregation in MEH-PPV Films", J. Phys. Chem. B., 104:237-255 (2000).

Peumans, et al., "Small Molecular Weight Organic Thin-Film Photodetectors and Solar Cells", J. Appl. Phys., 93:3693-3723 (2003).

Photoconductivity Conference, Atlantic City, NJ, Nov. 4-6, 1954, Wiley.

Rong, H. et al., "A continuous wave Raman Silicon laser", Nature, vol. 433, pp. 725-728 (2005).

Sargent, E.H., "Infrared Quantum Dots", Advanced Materials, vol. 17, pp. 515-522 (2005).

Schlamp, et al., "Improved Efficiencies in Light Emitting Diodes Made with CdSe(CdS) Core/Shell Type Nanocrystals and Semiconducting Polymer", J. Appl. Phys., 82:5837-5842 (1997).

Steckel, et al., "1.3μm to 1.55μm Tunable Electroluminescence from PbSe Quantum Dots Embedded Within an Organic Device", Adv. Mater., 15:1862-1866 (2003).

Stok, et al., "Lighting the Local Area: Optical Code-Division Multiple Access and Quality of Service Provisioning", IEEE Network, pp. 42-46 (Nov./Dec. 2000).

Tessler, N. et al., "Efficient near-infrared polymer nanocrystal light-emitting diodes", Science, vol. 295, pp. 1506-1508 (2002).

Wang, et al., "Photoconductivity of CdS Nanocluster-Doped Polymers", Chem. Phys. Lett., 200:71-75 (1992).

Wei, et al., "Effect of crystalline microstructure on the photophysical performance of polymer/perylene composite films", Chinese Physics, vol. 12, No. 4, pp. 426-432 (Apr. 2003).

Wessels, J.M. et al., "Optical and electrical properties of three-dimensional interlinked gold nanoparticles assemblies ", Journal of the American Chemical Society, vol. 126, pp. 3349-3356 (2004).

Yoshino, et al., "Near IR and UV Enhanced Photoresponse of $C_{60}$-doped Semiconducting Polymer Polymer Photodiode", Adv. Mater., 11:1382-1385 (1999).

Yu, D. et al., "n-Type Conducting CdSe Nanocrystal Solids", Science, vol. 300, pp. 1277-1280 (2003).

* cited by examiner

OPTICALLY-REGULATED OPTICAL EMISSION USING COLLOIDAL QUANTUM DOT NANOCRYSTALS

CROSS REFERENCE TO RELATED U.S. PATENT APPLICATIONS

This patent application relates to U.S. provisional patent application Ser. No. 60/563,012 filed on Apr. 19, 2004 entitled MULTI-COLOR OPTICAL AND INFRARED EMISSION USING COLLOIDAL QUANTUM NANOCRYSTALS.

FIELD OF THE INVENTION

The present invention relates to visible-, or infrared-emission using colloidal quantum nanoparticles to achieve a spectrally-tailored multi-color emission. More particularly, the present invention provides several light-emitting device structures using colloidal quantum dots including a structure using multiple separated layers each containing a pre-selected diameter of colloidal particles and a structure which uses layers containing mixtures of nanocrystals of different diameters which emit at different wavelengths depending on the diameter. Devices using electrical or a combination of electrical and optical stimulation of luminescence are disclosed. The spectrum of luminescence of a given device is controllable through the combination of optical and electrical stimuli.

BACKGROUND OF THE INVENTION

Efficient light emission at a chosen wavelength, or combination of wavelengths, or a designed spectrum of wavelengths, is of great interest in many applications. In displays, it is desirable to be able to choose three distinct colours in the visible range. For lighting applications, tailoring of a single spectral profile is desired to achieve bright white light generation. For communications, it is desirable to generate and modulate light in the infrared range 1270 nm-1610 nm, as specified by the coarse wavelength-division multiplexing standard. In night vision, it is important to convert invisible (infrared light) signals into proportional, spatially-resolved signals which are visible. In all such applications, efficiency, brightness, and spectral control form key requirements.

Quantum dots, or colloidal quantum nanocrystals, are particles of semiconductor on the length scale 1 to 20 nm broadly, but preferably 2-10 nm, and can provide size-tunable luminescence spectra which the present inventors and others have shown to be customizable across the infra-red and visible spectral ranges. When incorporated into semiconducting polymers, it is possible to inject charge into these matrix materials and ensure that either separate electrons and holes, or electron-hole pairs known as excitons, are transferred from the semiconducting polymer to the nanocrystals. This energy transfer process is a necessary step for subsequent net emission of light from the quantum dots. It is of critical importance in applications involving electroluminescence to ascertain and control the efficiency of energy transfer from the polymer to the nanocrystals.

Solution-processible devices based on colloidal quantum dots embedded in a semiconducting polymer matrix represent a promising basis for monolithic integration of optoelectronic functions on a variety of substrates including silicon, glass, III-V semiconductors, and flexible plastics. Reports of electroluminescence in the visible and infrared [*Handbook of Organic-Inorganic Hybrid Materials and Nanocomposites* (ed. H. S. Nalva), American Scientific Publishers, 2003], as well as photovoltaic [W. U. Huynh, X. Peng, A. P. Alivisatos, *Adv. Mater.* 11, 923 (1999)] and optical modulation [S. Coe, W.-K. Woo, M. Bawendi, V. Bulovic, *Nature* 420, 19 (2002)] phenomena in the visible, point to the possibility of combining a variety of useful optical and optoelectronic functions on a single platform.

Much work, including that on size-selective precipitation of nanocrystals to achieve the greatest possible monodispersity, has focused on narrowing emission, absorption, and modulation linewidths. Once such control over spectral properties has been achieved, it then becomes attractive to combine a number of different families of quantum dots in order to engineer a broader spectral shape: applications of such broadband or spectrally-engineered devices include multi-color light emitters for color displays; white light emitters for illumination; and, in the infrared, multi-wavelength emitters for coarse wavelength-division multiplexing and code-division multiple access [A. Stok, E. H. Sargent, IEEE Network 14, 42 (2000)}, useful in for example telecom integrated circuits (ICs).

BRIEF DESCRIPTION OF THE DRAWINGS

The layered structure and the light-emitting device produced according to the present invention will now be described, by way of example only, reference being made to the accompanying drawings, in which.

SUMMARY OF THE INVENTION

Figure 1:
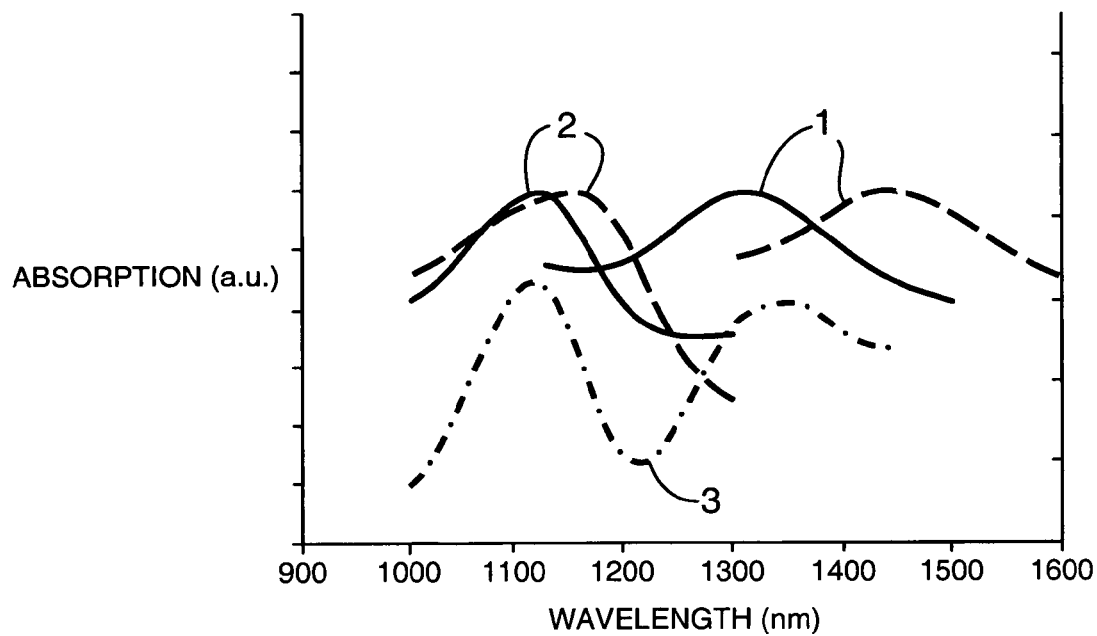
FIG. 1 shows an absorption spectra of two groups of nanocrystals (1, 2) in solution before (dashed lines) and after (solid lines) ligand exchange. Curve 3 provides the absorption spectrum of the light-emitting structure.

The present invention provides methods and devices useful for the emission of light which occurs in proportion with an electrical signal, an optical signal, or a combination of both. The emission of light may occur due to the passage of current through a light-emitting polymer, or due to energy transfer of excitons from this polymer to light-emitting quantum dots or quantum nanoparticles. Optical sensitivity is achieved through the inclusion of another species of quantum nanoparticles whose absorption is generally at longer wavelengths relative to the light-emitting material. Light incident upon the device results in an enhanced current flow in the presence of an applied bias, and thus enhanced excitation of the light-emitting moity is achieved in proportion with the optical power absorbed by the light-absorbing moity. Two device architectures are presented, one based on a mutilayer structure in which the functions of light absorption and light emission are separated, and the other in which these functions are integrated within a single active region.

Thus, an embodiment of the present invention provides a device and method for converting an infrared (1R) image, projected onto the device, into a visible image. The method of conversion is indirect in that the process involves converting the IR light into an electrical current; and then turns this electrical current into visible light emission, thereby producing visible light in proportion to the infrared light incident on the device.

The present invention provides designs and methods of fabrication of efficient polymer-nanocrystal light-emitting devices. The invention describes the series of layers to be deposited to form an efficient light-emitting device based on quantum dots or nanocrystals embedded in a semiconducting polymeric host. The density and spatial distribution of nanocrystals in the active layer of the device must be suitably chosen. The disclosure describes the means of determining areal concentration of the nanocrystals required for capture of the majority of excitons into the nanocrsytals prior to their recombination at opposite contacts. The areal concentration of nanocrystals N should be such that $Na^2 \gg 1$ where a is the nanocrystal radius; this requirement in turn describes the thickness of the emitting layer required if the packing density of the nanocrystals is fundamentally, or through design, limited to a known upper bound. The disclosure describes the placement of this electroluminescent layer relative to the injecting cathode and anode.

The present invention provides a design and method of fabrication of controlled-spectrum light-emitting devices based on semiconducting polymers and a mixture of different quantum nanocrystals. This invention concerns the formation of devices which produce a chosen spectrum of light, either in the visible or in the infrared spectral range, or both. The spectrum may be chosen to be white for lighting applications; or may alternatively represent a particular code for applications in detection and sensing in resource management and biomedical assays.

The present invention describes: 1) the size and spacing of the spectral layers required to achieve a particular luminescence spectrum from the nanocrystals; 2) the choice of nanocrystal properties and passivating ligand properties which simultaneously ensure efficient injection into the nanocrystals while keeping to a minimum the extent of inter-quantum-nanocrystal energy transfer; 3) the choice of multilayer device structure, and the manner in which to realize this device structure through combinations of water-soluble and organic-solvent-based nanocrystals and polymers.

In one aspect of the invention there is provided a device for detecting light in a pre-selected wavelength range and converting the detected light into light of at least one pre-selected wavelength and emitting the light at said at least one pre-selected wavelength, comprising:

a substrate and a first electrically conducting electrode layer on the substrate;

a first layer of first nanocrystals located on the first electrically conducting electrode layer which absorb light in said pre-selected wavelength range;

at least second layer of at least second nanocrystals which emit light at said at least one pre-selected wavelength located on the first layer of first nanocrystals; and a second electrically conducting electrode layer on the at least second layer of the second nanocrystals, wherein at least one of said substrate and first electrically conducting electrode layer and said second electrically conducting electrode layer is substantially transparent to the light in the pre-selected wavelength range and light at the at least one pre-selected wavelength, and wherein when the light in said pre-selected wavelength range is incident on said first layer of first nanocrystals a photocurrent is responsively produced when a voltage is applied between the first and second electrically conducting electrode layers, and wherein said photocurrent acts to pump the at least second layer of the at least second nanocrystals which responsively emit light at the at least one pre-selected wavelength.

In another aspect of the present invention there is provided device for detecting light in a pre-selected wavelength range and converting the detected light into light of at least one pre-selected wavelength and emitting the light at said at least one pre-selected wavelength, comprising:

a substrate and a first electrically conducting electrode layer on the substrate;

a polymer matrix located on the first electrically conducting electrode layer, the polymer matrix containing a mixture of nanocrystals, the mixture including at least first nanocrystals which absorb light in a pre-selected wavelength range, and a light emitting member located in the polymer matrix which emits light at said at least one pre-selected wavelength; and a second electrically conducting electrode layer located on the polymer matrix, wherein at least one of said substrate and first electrically conducting electrode layer and said second electrically conducting electrode layer is substantially transparent to light in the pre-selected wavelength range and light at said at least one pre-selected wavelength, wherein when light in the pre-selected wavelength range is incident on the polymer matrix and absorbed by the first nanocrystals, a photocurrent is responsively produced when a voltage is applied between the first and second electrically conducting electrode layers, and wherein said photocurrent acts to pump the second nanocrystals which responsively emit light at said at least one pre-selected wavelength.

The present invention also provides a method for detecting light in a pre-selected wavelength range and converting the detected light into light of at least one pre-selected wavelength and emitting the light at said at least one pre-selected wavelength, comprising the steps of:

applying a pre-selected voltage across a laminate structure which includes first and second electrode layers, and a polymer matrix located between said first and second electrode layers, said polymer matrix containing first nanocrystals which absorb light in a pre-selected wavelength range, and a light emitting member located in the polymer matrix which emits light at said at least one pre-selected wavelength; and wherein at least one or both of said first and second electrode layers is substantially transparent to the light in the pre-selected wavelength range and the light at said at least one pre-selected wavelength, and wherein when the light in the pre-selected wavelength range is incident on the polymer matrix and absorbed by the first nanocrystals, a photocurrent is responsively produced when said pre-selected voltage is applied between the first and second electrode layers, and wherein said photocurrent acts to pump the light emitting member located in the polymer matrix which responsively emits light at said at least one pre-selected wavelength.

The present invention also provides a method for detecting light in a pre-selected wavelength range and converting the detected light into light of at least one pre-selected wavelength and emitting the light at said at least one pre-selected wavelength, comprising the steps of:

applying a pre-selected voltage across a structure which includes first and second electrically conducting electrode layers, and located between the first and second electrode layers, a first layer of first nanocrystals on said first electrode layer which absorb light in said pre-selected wavelength range, and at least a second layer of at least second nanocrystals on the layer of first nanocrystals which emit light at said at least one pre-selected wavelength, and said second electrically conducting electrode layer being located on the at least a second layer of second nanocrystals;

wherein at least one or both of said first and second electrode layers is substantially transparent to light in the pre-selected wavelength range and light at said at least one pre-selected wavelength; and wherein when light in said pre-selected wavelength range is incident on said first layer of first nanocrystals a photocurrent is responsively produced when a voltage is applied between said first and second electrode layers, and wherein said photocurrent acts to pump the at least a second layer of at least second nanocrystals which responsively emit light at said at least one pre-selected wavelength.

DETAILED DESCRIPTION OF THE INVENTION

Definitions

As used herein, the phrase "colloidal quantum dots" (or "colloidal quantum nanocrystals", or "nanocrystals") means particles of inorganic semiconductor, broadly in a range from about 1 to about 20 nm, but preferably in the range from about 2 to about 10 nm in diameter, which, through the use of appropriate capping ligands (organic molecules), may be dispersed in a solvent such as toluene, water, hexane, etc. It will be appreciated that the upper size limit on the colloidal quantum nanocrystals useful in the present invention is reached when the larger nanocrystals have too small quantum size effect to provide effective spectral tuning.

In certain applications it is important that the nanocrystals show a sudden onset of absorbance. For this to be achieved it is important that the nanocrystals be substantially the same shape and size, thus exhibiting monodispersity. For example, the nanocrystals may have a distribution of dimensions such that no more than about 10% of the nanocrystals have a dimension greater than about 10% of the average dimension of the nanocrystals.

In other applications, monodispersity among the nanocrystals is not important.

As used herein, the term "conducting" means sufficiently inclined to flow electrical current as to provide sufficient injection of charge carriers without incurring an excessive voltage drop.

As used herein, the term "semiconducting" means a material having a bandgap between about 0.4 and about 4.0 eV.

As used herein, the term "insulating" means a material which does not pass current strongly under the application of a voltage bias.

As used herein, the term "ligand" means a molecule on the surface of a nanoparticle which achieves passivation and renders nanoparticles soluble in certain solvents.

As used herein, the term "passivating" in regards to the quantum dots or nanoparticles, means reducing the density of defect states on the surface of a nanoparticle, thereby increasing the lifetime of excited states (excitons) within.

As used herein, the term "unsatisfied bonds" refers to atoms at the surface of the nanocrystal which, by virtue of being at the surface, do not have all of their chemical bonds satisfied.

As used herein, the term "electroluminescent" or "electroluminescence" means the production of light driven by the injection of current.

As used herein, the term "photoluminescent" or "photoluminescence" means the production of light driven by the absorption of light.

As used herein, the phrase "ligand exchange" means the replacement of one class of organic ligands with a new class. Replacement may occur in part or in whole.

As used herein, the phrase "energy transfer" means the conveyance of energy from an initial state to a final state.

As used herein, the phrase "areal concentration" means the number of nanoparticles in an area divided by that area.

As used herein, the term "exciton" means a pair consisting of an electron and a hole which are bound to one another by virtue of their opposite charge.

The inventors disclose herein for the first time the fabrication and investigation of electroluminescent devices which combine two families of colloial quantum dots to achieve spectrally-tailored two-color emission. This is exemplified using devices produced which employ PbS quantum dot nanocrystals in the 1.1 to 1.6 µm spectral range.

Colloidal PbS nanocrystals were synthesized using an organometallic route requiring a single, short nucleation followed by slower growth of existing nuclei. The method included using the hot injection technique with rapid addition of reagents into the reaction vessel that contains the hot coordinating solvent as disclosed in Colloidal PbS Nanocrystals with Size-Tunable Near-Infrared Emission: Observation of Post-Synthesis Self-Narrowing of the Particle Size Distribution Advanced Materials, Volume 15, Issue 21, Date: November, 2003, Pages: 1844-1849; M. A. Hines, G. D. Scholes.

In the present invention the inventors based the synthesis after the method disclosed in C. B. Murray, D. J. Norris, M. G. Bawendi, J. Amer. Chem. Soc. 115, 8706 (1993) to provide monodisperse colloidal PbS nanocrystals over a wide range of possible sizes. For the studies disclosed herein, two groups of nanocrystal with different sizes were chosen. Group I labels the larger nanocrystals with a smaller effective bandgap; and group II the smaller nanocrystals with a larger effective bandgap.

As disclosed in L. Bakueva, S. Musikhin, M. A. Hines, T.-W. F. Chang, M. Tzolov, G. D. Scholes, E. H. Sargent, *Appl. Phys. Lett.* 82, 2895 (2003) a post-synthetic ligand exchange was performed to replace the initial oleate ligands used for passivating the nanocrystal surface with pre-selected ligands.

The ligands attached to the surface of the colloidal nanocrystals serve the combined purposes of: 1) passivating electronic states (unsatisfied bonds) associated with atoms at the surface of the nanocrystals; 2) allowing the nanocrystals to be dispersed in the solvent; 3) providing a spatial separation between the nanocrystals, given approximately by the length of the ligands, thereby minimizing or regulating the rate of energy transfer among nearby nanocrystals.

Ligands used by previous researchers include TOPO (tri-octyl phosophine oxide); amine chains such as octadecylamine, dodecylamine, and octylamin; and pyridine. An example of a useful ligand is octadecylamine (C18). In contrast, Bakueva et al. reported the use of octylamine (C8).

Light-emitting structures were fabricated in accordance with the present invention on glass substrates with a transparent ITO anode electrode covered with layer of poly(p-phenylenevinylene) (PPV). Light emitting devices were fabricated which employed two distinct nanocomposite layer structures. The first, as shown generally at 10 in FIG. 2, includes an ITO anode electrode coated substrate 12 which forms a transparent anode electrode substrate with the substrate 12 comprised of typically glass or any other optically transparent material (polymeric, glass etc.), with the electrically conductive transparent ITO layer on the substrate. The transparent ITO anode electrode is coated with layer of poly(p-phenylenevinylene) (PPV) 14. A layer 16 of narrow-gap group I nanocrystals covers the PPV layer 14, an intervening hydrophilic polymer layer 18 covers layer 16 and a layer 20 of wider-gap group II nanocrystals was then formed which was about twice as thick as the first layer 16 covers layer 18 with the thin PPV layer 18 being present to prevent mixing between the two groups of nanocrystals I and II. A metal bilayer cathode 22 includes a magnesium (Mg) layer 24 on layer 20 and a gold (Au) layer 26 on top of the Mg layer 24. It will be understood the thickness of layer 20 is does not need to be twice as thick as layer 16.

In operation, light incident penetrates through ITO coated substrate 12 onto the first IR-absorbing layer 16, containing the group I nanocrystals, which responsively produces a photocurrent when this device is biased by a sufficient voltage V as shown. The flow of this photocurrent acts to pump the visible light emitting layer 20 of the electroluminescent device containing the larger bandgap group II nanocrystals, which produces and emits visible light which is proportional to the IR light incident on the IR-absorbing layer 16.

Figure 2:
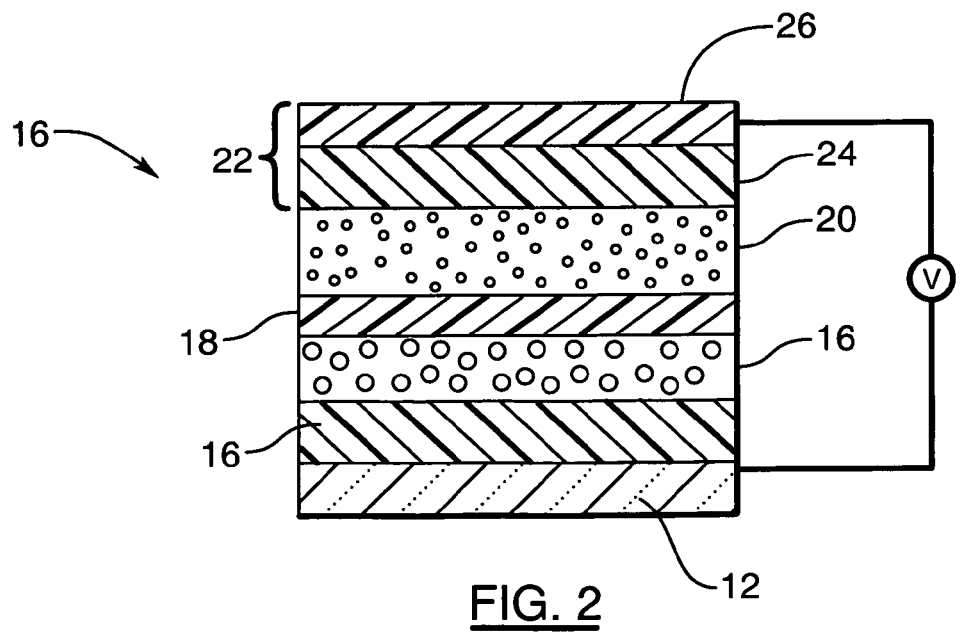
FIG. 2 is a schematic view of a first embodiment of a display device structure incorporating quantum dots constructed in accordance with the present invention.

It will be understood that while in certain applications it is important that the substrate and ITO electrode combination 12 be transparent, as is the case in the device 10 in FIG. 2, other embodiments falling within the scope of the present invention may comprise both top illumination and top-readout, so that only the final top electrode 22 needs to be transparent. Thus FIG. 2 shows a preferred embodiment of the multilayer device in which the IR-absorbing layer 16 is located on the side of the device from which light is incident, and thus as shown in FIG. 2 is located adjacent to the PPV layer 14 which is located on the ITO coated substrate 12.

Thus, device 10 of FIG. 2 comprises at least two active layers. One layer 16 serves the purpose of absorption/detection and the other layer 20 serves the purpose of light emission. It will be understood that the nanoparticles in layer 20 could be selected to emit not in the visible per se but in the IR as well. In this case the particles would be selected to emit at a different wavelength falling outside the range of wavelengths being detected.

While the above example used two active layers (16 and 20) of nanocrystals which absorb and emit light at different wavelengths, it will be understood that this is exemplary only, and that devices could be made with more than two layers of nanocrystals which emit light at different wavelengths. For example, instead of one visible light emitting layer 20, there could be two or more such layers each having nanoparticles which emit a different color. Alternatively, layer 20 could include different types of nanoparticles each emitting light at a different wavelength.

The density and spatial distribution of nanocrystals in each of the active layers of the device must be suitably chosen. The areal concentration of the nanocrystals required for capture of the majority of excitons into the nanocrsytals prior to their recombination at opposite contacts is important. The areal concentration N should be such that $Na^2 \gg 1$ where a is the nanocrystal radius; this requirement in turn describes the thickness of the emitting layer required if the packing density of the nanocrystals is fundamentally, or through design, limited to a known upper bound.

Thus, for the nanoparticles in the first layer, the areal concentration $N_1$ of the first colloidal quantum nanocrystals is such that $N_1 a^2 22\ 1$ where a is a radius of the first nanocrystals, and in the second layer, the areal concentration $N_2$ of the second colloidal quantum nanocrystals is such that $N_2 b^2 \gg 1$ where b is a radius of the second nanocrystals.

The PPV layer 14 may be replaced with any other conducting, semiconducting or insulating polymer layer as long as it functions to regulate the transport of electrons and holes into the active layers of the device. In the case of an insulating layer, a thin layer which is tunnel-transparent, to different degrees, for electrons and holes, allows control over the relative rate of injection of each carrier type into the layers on either side of it. A semiconducting layer, through its choice of band structure (homo/lumo offsets relative to the active polymers), similarly allows control over electron and hole injection rates. Similarly, a conducting polymer layer, through its choice of band-structure (homo/lumo offsets relative to the active polymers) allows control over electron and hole injection rates.

The conducting, semiconducting or insulating polymer layer 18 may be comprised of 1) semiconducting polymers such as MEH-PPV (poly(2-methoxy-5-(2'-ethyl-hexyloxy)-p-phenylene vinylene)) and associated poly-phenylene-vinylene derivatives, polyfluorine (PFO) and associated polyfluorine derivatives, and poly-thiophenes such as poly(3-octyl-thiophene) (P3HT), and poly(9,9-dioctylfluorene-co-bitiophene) (F8T2); 2) dielectric materials such as insulating polymers e.g. PMMA (poly-methyl-methacrylate) and inorganic or mixed organic-inorganic insulating dielectrics such as $SiO_2$, SiO, and $SiN_xO_y$; and 3) conducting polymer layers which may be used include PEDOT:PSS (Poly(3,4-ethylenedioxythiophene) poly(styrenesulfonate) aqueous dispersion) and doped MEH-PPV or PPV (poly-phenylenevinylene).

FIG. 2 shows a preferred structure which includes conducting, semiconducting or insulating layers for regulating charge flow however it will be understood the device would work without these layers 16 and 18.

Figure 3:
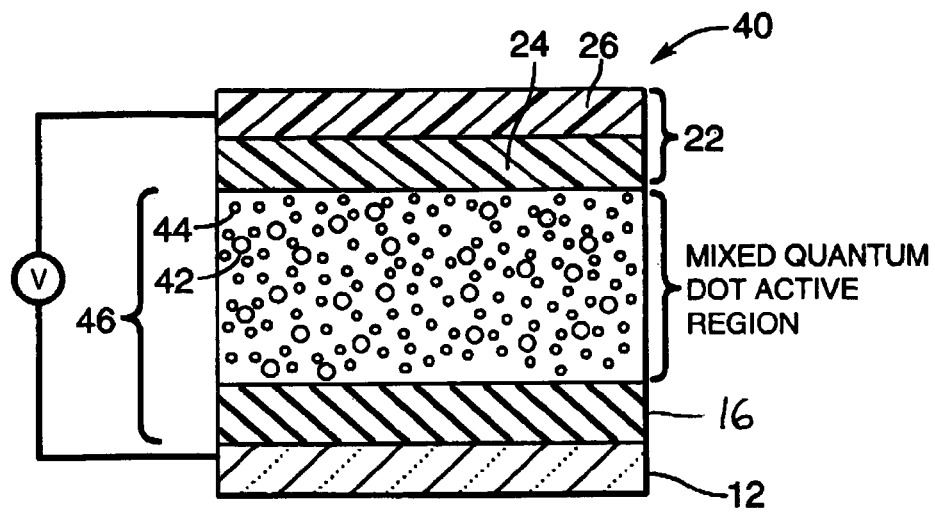
FIG. 3 is a schematic view of a second embodiment of a display device structure incorporating quantum dots.

The second structure, shown generally at 40 in FIG. 3 includes an ITO anode electrode-coated substrate 12 which forms a transparent anode electrode substrate 12 with the substrate again comprised of typically glass or other optically transparent polymer material, with the electrically conductive transparent ITO layer on the substrate. The transparent ITO anode electrode is coated with layer of poly(p-phenylenevinylene) (PPV) 46. Device 40 employs a uniform mixture of the two families 42 (group I) and 44 (group II) of nanocrystals inside a PPV matrix 46, resulting in total thickness of 1 μm. While a PPV matrix was used in this embodiment, it will be understood that other materials could be used. The polymer matrix serves the function of allowing the electronic transport of at least one of electrons and holes. A predominantly hole-conducting polymer would allow the transport of holes, with electrons being transported via nanoparticle-to-nanoparticle hopping. Alternatively, a balanced semiconductor with comparable electron and hole conductivities would allow balanced injection of electrons and holes through the same polymer matrix. The areal coverage by the light-emitting nanocrystal needs to exceed the threshold defined earlier with respect to the device 10 of FIG. 2. Metal bilayer cathode 22 includes magnesium (Mg) layer 24 on layer 46 and a gold (Au) layer 26 on top of the Mg layer 24. The electrical connections are the same as for device 10 in FIG. 2.

Device 40 may include PPV layer 14 or may be replaced with any other conducting, semiconducting or insulating polymer layer as long as it functions to regulate the transport of electrons and holes into the polymer matrix.

In operation, IR (or visible) light is incident on layer 46 through ITO/substrate 12 and PPV layer 14 and is absorbed by the larger group I IR-absorbing quantum dots 42, which responsively produces a photocurrent. This photocurrent flows and pumps the visible-emitting group II quantum dots 44 (or just the polymer itself in an embodiment that uses the polymer to generate the light and non nanocrystals) and these visible light-emitting nanoparticles responsively emit light.

Thus, device 40 of FIG. 3 comprises at least one active layer. The active layer 46 of interest in this device combines the function of detection and light emission. Again as with device 10 in FIG. 2, the nanoparticles which serve to emit light may be chosen to emit in the IR, and is not restricted to emission in the visible, the wavelength be outside the range of IR wavelengths being detected. Similarly, the nanoparticles which are used in the layer for absorbtion and detection could be tailored to absorb in the visible as well as the nanoparticles in the second emitting layer emitting in the visible, but preferably the absorption/detection nanoparticles would absorb in a longer wavelength portion of the visible spectrum than the particles in the emitting layer.

The polymer matrix may be made of semiconducting polymers such as MEH-PPV and associated poly-phe-nylene-vinylene derivatives, PFO and associated polyfluo-rine derivatives, and poly-thiophenes such as P3HT. The polymer matrix is selected to provide for photoconduction when combined with the light-detecting nanocrystals; and for electrical excitation of the light-emitting nanocrystals.

The device configurations of FIGS. 2 and 3 provide devices for converting an infrared (IR) image, projected onto the device, into a visible image. The method of conversion is indirect in that the process involves converting the IR light into an electrical current; and then turns this electrical current into visible light emission, thereby producing visible light in proportion to the infrared light incident on the device.

Therefore, both types of device comprise light-detecting and light-emitting nanoparticle or quantum dot components. Monodispersity is required in the light-emitting group II quantum nanoparticles of the active layer which emits the visible light. However monodispersity is not necessarily required of the nanoparticles which implement the light-detecting function, namely the IR absorbing group I nanoparticles. The light-emitting function can be implemented by 1) a polymer alone or 2) a blend of polymer and nanocrystals. If the light-emitting part of the device is required to produce a narrow spectrum of emission, then monodispersity becomes important.

In another embodiment of the invention in which the light-emitting function can be implemented by a polymer alone, the function of infrared optical detection is again implemented using infrared-absorbing nanocrystals. The process of emission now occurs from the polymer itself. The polymer is chosen from the same set enumerated above: MEH-PPV, P3OT, etc. since these are light-emitting polymers which can be further tailored to produce light in the red, green, or blue spectral regions. Thus this device strategy is as mentioned above, except that it does not involve the use of visible-emitting quantum dots, but the polymer matrix itself takes over this role.

In other embodiments of the device, additional layers may be included, for example, a semiconductor (e.g. PPV, the s/c polymer), a conductor (e.g. a metal, potentially an ultrathin layer), and/or a dielectric/insulator (e.g. $SiO_2$, LiF, etc.) may be inserted anywhere in the device, for example between the layer 16 and the PPV layer 14 of device 10. The layers may be thin enough to enable them to be optically transparent, or nearly optically transparent in cases where they are located in between the substrate and the first layer or in between the two main layers 16 and 20 in the multilayer device, or they may be placed on the very top of the device on layer 26.

Figure 5:
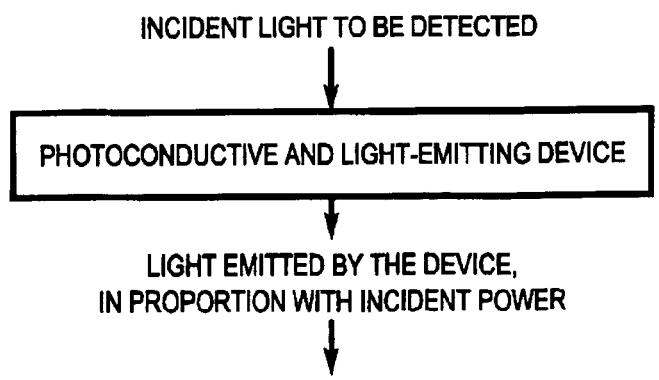
FIG. 5 shows a third embodiment of a display device structure incorporating quantum dots.

As shown in FIG. 5 the devices may be configured to receive light that may originate not from a specific light source but could be incident light from a viewing field which one desires to image, which is intended to strike the sample, and this light illuminates the first and at least second layers of first and second colloidal quantum nanocrystals. The light incident may be accepted without deliberate spectral filtering, or its spectral content may be selected using an optical filtering layer. Its wavelength is chosen to promote absorption, and thus photoconduction, in one, but typically not both, active layers of the device structure.

Both structures exemplified by the devices of FIGS. 2 and 3 exhibited absorption spectra with two maxima corresponding to the two types of nanocrystals (FIG. 1). The structures were investigated using optical methods and then completed via the deposition of a metallic cathode similar to that used in L. Bakueva, S. Musikhin, M. A. Hines, T.-W. F. Chang, M. Tzolov, G. D. Scholes, E. H. Sargent, "Size-tunable infrared (1000-1600 nm) electroluminescence from PbS quantum-dot nanocrystals in a semiconducting polymer," Applied Physics Letters, vol. 82, no. 17, pp. 2895-2897, 2003, comprising a Mg film obtained by vacuum evaporation and protected from the ambient atmosphere with a thin capping Ag film. In both device structures, the active region is separated from the anode by a polymer layer, but is in direct contact with the cathode, as required (see Bakueva, S. Musikhin, E. H. Sargent, H. E. Ruda, and A. Shik, "Luminescence and Photovoltaic Effects in Polymer-Based Nanocomposites," Handbook of Organic-Inorganic Hybrid Materials and Nanocomposites, vol. 2, chapter. 5, pp. 181-215, 2003) by the less efficient transport of electrons in PPV.

Figure 4:
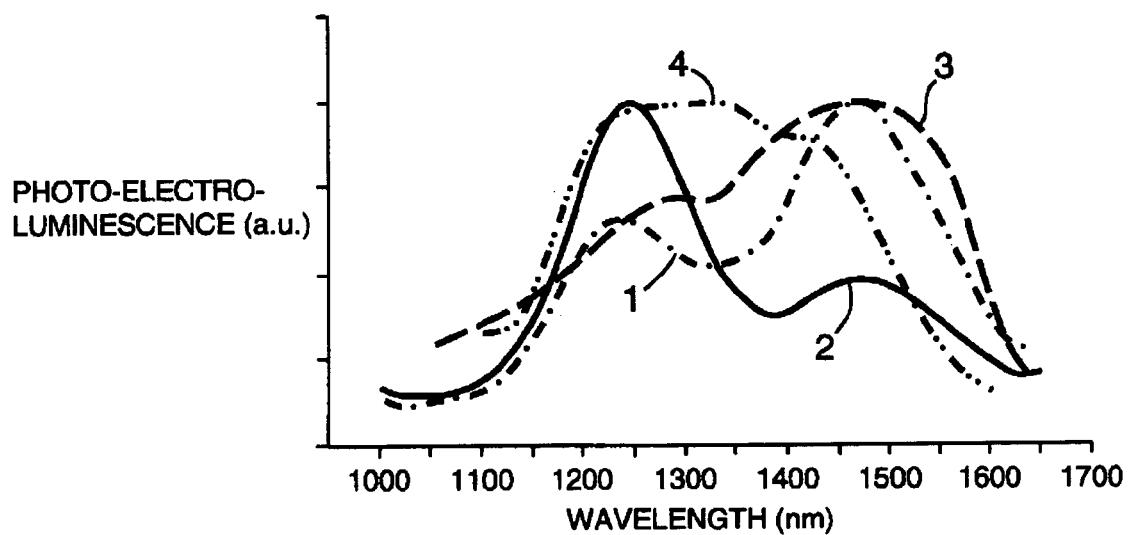
FIG. 4 shows the photoluminescence spectra of the double-layer structure for excitation through the substrate (1) and from the upper side (2), its electroluminescence spectrum (3), and photoluminescence spectrum of the mixture layer (4)

Photoluminescence spectra of the structures were obtained using continuous wave (c.w.) excitation by a semiconductor laser at 831 nm. At this wavelength the polymer matrix is transparent and the exciting light absorbed only in the nanocrystals. The resulting spectra for a typical sample with two separate layers of different nanocrystals are shown in FIG. 4. These have two distinct peaks at $\lambda$=1240 nm and $\lambda$=1475 nm. Comparison with the absorption spectra shows a noticeable Stokes shift ≅106 meV, the same for both peaks. Relative intensities of the peaks depend on the geometry of excitation: illumination through the substrate increases absorption and hence luminescence in the narrow-gap nanocrystal layer adjacent to the substrate, while illumination from the opposite side excites preferentially the wide-gap layer adjacent to the illuminated surface. If we define the absorbance of the narrow- (group I) and wide-gap (group II) layers to be, respectively, $\alpha$ and $\beta$, then for illumination from the substrate the fractions of absorbed light for these two layers are $\alpha$ and $\beta(1-\alpha)$ so that the ratio of luminescence peak intensity should be $\alpha/\beta(1-\alpha)$. For illumination from the opposite side this ratio is $\alpha(1-\beta)/\beta$. Comparing these formulae with relative peak intensities for curves 1 and 2 in FIG. 4, we find that $\alpha\approx30\%$ and $\beta\approx60\%$, in good agreement with the thickness ratio of these two layers mentioned above.

In contrast to the two-layer structure 10 of FIG. 2, the device 40 containing a mixture of different nanocrystals of FIG. 3 demonstrated one wide luminescence band covering the entire spectral region of interest, from about 1.1 to about 1.6 μm. Since the absorption spectrum in the same samples does have a distinctive double-peak structure (FIG. 1), the widening of the spectrum is attributed to re-absorption, re-emission, as well as interdot energy transfer amongst nanocrystals within and between the two groups. In the structures with well-separated layers, the latter process is expected to be negligible.

While the above disclosed device 40 used two types of nanocrystals 42 and 44 which emit at different wavelengths, it will be understood that this is exemplary only, and that devices could be made with more than two types of nanocrystals. For example, instead of one visible light emitting type of nanocrystal 44, there could be two or more visible light emitting nanocrystals, each emitting a different wavelength.

Prior to electroluminescence experiments, the samples were subjected to electrophysical measurements with the complex impedance measured in large intervals of applied bias and signal frequencies. The current-voltage characteristic in all samples was almost symmetric and slightly superlinear. Noticeable electroluminescence began at V=3 V. All data for spectral dependence and internal efficiency of electroluminescence provided herein were obtained at biases of V=3.5 V and current densities of 10 mA/cm$^2$.

Curve 3 in FIG. 4 shows the spectrum of electroluminescence in a two-layer structure. The position of the long-wavelength peak is almost the same as in the photoluminescence spectrum while the short-wavelength peak has a noticeable red shift compared to the photoluminescence spectrum. In contrast to photoluminescence, electroluminescence can be measured only through the transparent substrate. The shift of short-wavelength peak might be attributed to partial re-absorbtion by the layer of group I nanocrystals.

Absolute values of internal electroluminescence efficiency were found to vary from sample to sample; the largest measured value was 3.1% [7]. When the polarity of the applied bias was reversed, electroluminescence was still observed, consistent with the essentially symmetric character of the current-voltage characteristic.

In the present work, the approach to ligand exchange was found to play an important role in the realization of increased-efficiency electroluminescent devices. The nanocrystals capped by oleate ligands as a result of the synthetic procedure exhibited a good photoluminescence efficiency as high as 23% in solution. When used to make devices, these nanocrystals, before being capped having their long ligands replaced by shorter ones, exhibited no measurable electroluminescence. It was necessary to use nanocrystals on which ligand exchange had been carried out, thus which were capped with octadecylamine, to achieve 3.1% measured electroluminescence internal efficiency. Some of the present inventors have previously disclosed the necessity of carrying out ligand exchange to achieve an observable electroluminescence signal, see L. Bakueva, S. Musikhin, M. A. Hines, T.-W. F. Chang, M. Tzolov, G. D. Scholes, E. H. Sargent, "Size-tunable infrared (1000-1600 nm) electroluminescence from PbS quantum-dot nanocrystals in a semiconducting polymer," Applied Physics Letters, vol. 82, no. 17, pp. 2895-2897, 2003. It was disclosed in this reference that the ligand exchange alters both the end function group passivating the nanocrystal surface and also the length of the ligand which presents a potential obstacle to energy transfer from electrodes and polymer matrix into nanocrystals. The present work suggests that the longer octodecylamine ligand used in the present work, compared to the octylamine ligand used in the reference just cited to Bakueva et al. (Size-tunable infrared (1000-1600 nm) electroluminescence from PbS quantum-dot nanocrystals in a semiconducting polymer), provides more effective passivation while not seriously impeding energy transfer.

Examples of the ligand attached to a surface of the colloidal quantum nanocrystals include, but not limited to, oleate, hexylamine, octylamine, dodecylamine, octadecylamine, tri-octyl phosphine oxide, and pyridine.

In a third embodiment the display device structure incorporating quantum nanoparticles may include a light source for illuminating the colloidal quantum nanocrystals, the light source emitting light at one or more pre-selected wavelengths for absorption by the different colloidal quantum nanocrystals. The use of a tunable light source permits variation in the selective excitation of a defined subset of the multi-component nanocrystal mixture or multi-layer structure. This in turn results in different degrees of energy transfer (if any) among excited vs. unexcited dots, and correspondingly a different spectrum of emission from the variously excited quantum nanoparticles in proportion with each subpopulation's level of excitation, its areal density, and its internal emission efficiency.

Copending U.S. patent application Ser. No. 60/641,766 filed Jan. 7, 2005, entitled "Quantum Dot-Polymer Nanocomposite Photodetectors and Photovoltaics" discloses a means of detecting infrared light using quantum dots combined with a polymer. This relates to the present work in that this patent application describes in greater detail the composition of layers required to make efficient infrared detectors. The active region of these detectors (the layer made up of infrared-absorbing nanocrystals combined with a polymer) can be used as the light-detecting portion of the device described herein.

In summary, the inventors have fabricated and disclosed herein nanocomposite structures containing PbS nanocrystals of two different sizes which allow tailoring of the emission spectrum of luminescent devices. Depending on device structure selected, in particular the use of two separated layers vs. a mixture of nanocrystals, the structures demonstrated light emission either in two infrared frequency peaks corresponding to the spectral region of about 1.1 to about 1.6 µm or in a wide band spanning this same spectral region. For two-color structures, it was shown that it is possible to vary the relative intensity of the peaks over a wide range through the choice of excitation conditions. The replacement of oleate with octodecylamine ligands allowed us to increase the internal efficiency of electroluminescence to 3.1%.

While the results disclosed herein employed colloidal PbS nanocrystals of two different sizes to give two different colors upon excitation, it will be understood that the present invention is in no way limited to devices using either just PbS or two different sizes of nanocrystals to give two emission wavelengths. For example, three or more differently sized colloidal quantum dots of PbS could be used to give three or more different colors or emission wavelengths. The same issues and degrees of freedom would apply: the exchange of energy amongst the three spectral components, and the freedom to make distinct choices of ligands to passivate, stabilize, and separate the three different nanocrystals. Similarly, many inorganic semiconductors in addition to PbS can be used to form quantum dots: examples in the infrared include II-V semiconductors such as InAs, and other IV-VI semiconductors such as PbSe; and in the visible include CdS, CdSe. The colloidal quantum nanocrystals may comprise a core/shell structure including a core made of a pre-selected type of material and a shell material surrounding the core made of a different pre-selected type of material. A non-limiting example of such a core/shell structure is the core-shell system ZnS(CdSe).

As used herein, the terms "comprises", "comprising", "including" and "includes" are to be construed as being inclusive and open ended, and not exclusive. Specifically, when used in this specification including claims, the terms "comprises", "comprising", "including" and "includes" and variations thereof mean the specified features, steps or components are included. These terms are not to be interpreted to exclude the presence of other features, steps or components.

The foregoing description of the preferred embodiments of the invention has been presented to illustrate the principles of the invention and not to limit the invention to the particular embodiment illustrated. It is intended that the scope of the invention be defined by all of the embodiments encompassed within the following claims and their equivalents.

Therefore what claimed is:

1. A device for detecting light in a pre-selected wavelength range and converting the detected light into light of at least one pre-selected wavelength and emitting the light at said at least one pre-selected wavelength, comprising:
   a substrate and a first electrically conducting electrode layer on the substrate;
   a first layer of first nanocrystals located on the first electrically conducting electrode layer which absorb light in said pre-selected wavelength range;
   at least one second layer of second nanocrystals which emit light at said at least one pre-selected wavelength located on the first layer of first nanocrystals; and
   a second electrically conducting electrode layer on the at one least second layer of second nanocrystals,
   wherein at least one of said substrate and first electrically conducting electrode layer and said second electrically conducting electrode layer is substantially transparent to the light in the pre-selected wavelength range and light at the at least one pre-selected wavelength, and
   wherein when the light in said pre-selected wavelength range is incident on said first layer of first nanocrystals a photocurrent is responsively produced when a voltage is applied between the first and second electrically conducting electrode layers, and
   wherein said photocurrent acts to pump the at least one second layer of the second nanocrystals which responsively emit light at the at least one pre-selected wavelength.

2. The device according to claim 1 including
   a first layer located between said first electrically conducting electrode layer and said first layer of first nanocrystals, wherein the first layer is selected from a group comprising a conducting layer, a semiconducting layer, and an insulating layer,
   a second layer located between said first layer of first nanocrystals and said at least one second layer of second nanocrystals, wherein the second layer is selected from a group comprising a conducting layer, a semiconducting layer, and an insulating layer,
   wherein said first and second layers function to regulate the transport of electrons and holes into the first and at least one second layers of nanocrystals.

3. The device according to claim 1 wherein the first nanocrystals are of a material and size, each of which is selected so that said first nanocrystals absorb light in said pre-selected wavelength range, and wherein the second nanocrystals are substantially monodisperse and are of a material and size, each of which is selected so that said second nanocrystals emits at the at least one pre-selected wavelength.

4. The device according to claim 1 wherein an areal concentration $N_1$ of said first nanocrystals is such that $N_1 a^2 > 1$ where a is a radius of the first nanocrystals, and wherein an a real concentration $N_2$ of said second nanocrystals is such that $N_2 b^2 >> 1$ where b is a radius of the second nanocrystals.

5. The device according to claim 1 wherein the first and the at least one second nanocrystals are made of the same material, and wherein the first nanocrystals have a first pre-selected mean diameter selected so that the first nanocrystals absorb light in said pre-selected wavelength range, and wherein the second nanocrystals are substantially monodisperse and have a second pre-selected mean diameter so that the second nanocrystals emit light at the at least one pre-selected wavelength.

6. The device according to claim 1 wherein the pre-selected wavelength range is in a spectral region selected from a group comprising an infrared spectral region and a visible spectral region, and wherein the at least one pre-selected wavelength is a visible wavelength but at a higher wavelength than wavelengths in said visible spectral region.

7. The device according to claim 6 wherein the semiconducting layer is selected from the group consisting of poly(2-methoxy-5-(2'-ethyl-hexyloxy-)-p-phenylene vinylene) (MEH-PPV) and associated poly-phenylene-vinylene derivatives, polyfluorine (PFO) and associated polyfluorine derivatives, and poly-thiophenes, poly(3-octyl-thiophene) (P3HT), poly(9,9-dioctyifluorene-co-bitiophene) (F8T2), and wherein the insulating layer is selected from the group consisting of PMMA (poly-methyl-methacrylate) and insulating dielectrics selected from a group comprising inorganic and mixed organ-inorganic dielectrics, $SiO_2$, SiO, and $SiN_xO_y$, and wherein the conducting layer is selected from the group consisting of poly(3,4-ethylenedioxythiophene) poly(styrenesulfonate) (PEDOT:PSS), and doped MEH-PPV and doped PPV (poly-phenylene-vinylene).

8. The device according to claim 2 wherein the first layer located between said first electrically conducting electrode layer and said first layer of first nanocrystals is poly(p-phenylenevinylene) (PPV).

9. The device according to claim 1 wherein the first and the second nanocrystals are selected from the group consisting of inorganic semiconductors.

10. The device according to claim 9 wherein the first and the second nanocrystals are selected from the group consisting of III-V semiconductors and IV-VI semiconductors.

11. The device according to claim 10 wherein the III-V semiconductors are InAs, and wherein the IV-VI semiconductors are selected from the group consisting of PbSe, CdS and CdSe.

12. The device according to claim 1 wherein the first and the second nanocrystals have a core/shell structure comprising a core made of a pre-selected type of material and a shell material surrounding the core made of a different pre-selected type of material.

13. The device according to claim 12 wherein the nanocrystals with the core/shell structure are ZnS(CdSe).

14. The device according to claim 1 wherein the first and the second nanocrystals are PbS nanocrystals.

15. The device according to claim 1 wherein the at least one second layer of second nanocrystals is two or more layers of nanocrystals, each layer including nanocrystals of a pre-selected size for emitting light of wavelengths different from all the other layers of nanocrystals.

16. The device according to claim 1 wherein the first and second nanocrystals have pre-selected ligands attached to a surface of the first and the second nanocrystals.

17. The device according to claim 16 wherein the pre-selected ligands attached to the surface of the first and the second nanocrystals are selected from the group consisting of oleate, hexylamine, octylamine, dodecylamine, octadecylamine, tri-octyl phosphine oxide, butylamine, and pyridine.

18. The device according to claim 16 wherein the pre-selected ligands attached to the surface of the first and the second nanocrystals are octadecylamine (C18).

19. The device according to claim 1 including a light source for illuminating the first and at least one second layers of the first and the nanocrystals, the light source emitting light at one or more pre-selected wavelengths for selective absorption by the first and the nanocrystals.

20. The device according to claim 1 wherein at least one of the first and the nanocrystals has a core/shell structure comprising a core made of a pre-selected type of material and a shell material surrounding the core made of a different pre-selected type of material.

21. The device according to claim 20 wherein the nanocrystals with the core/shell structure are ZnS(CdSe).

22. The device according to claim 1 wherein the nanocrystals have a size in a range from about 1 to about 20 nm.

23. The device according to claim 1 wherein the nanocrystals have a size in a range from about 2 to about 10 nm.

24. The device according to claim 1 wherein said second layer of the second nanocrystals include two or more types of nanocrystals, wherein each type are of a material and size, each of which is selected so that each type of nanocrystal emits light of pre-selected wavelengths in the visible or infrared, or combinations thereof.

25. A device for detecting light in a pre-selected wavelength range and converting the detected light into light of at least one pre-selected wavelength and emitting the light at said at least one pre-selected wavelength, comprising:

a substrate and a first electrically conducting electrode layer on the substrate;

a polymer matrix located on the first electrically conducting electrode layer, the polymer matrix containing a mixture of nanocrystals, the mixture including at least, first nanocrystals which absorb light in a pre-selected wavelength range, and a light emitting member located in the polymer matrix which emits light at said at least one pre-selected wavelength; and a second electrically conducting electrode layer located on the polymer matrix, wherein at least one of said substrate and first electrically conducting electrode layer and said second electrically conducting electrode layer is substantially transparent to the light in the pre-selected wavelength range and light at said at least one pre-selected wavelength, wherein when light in the pre-selected wavelength range is incident on the polymer matrix and absorbed by the first nanocrystals, a photocurrent is responsively produced when a voltage is applied between the first and second electrically conducting electrode layers, and wherein said photocurrent acts to pump the light emitting member, which responsively emit light at said at least one pre-selected wavelength.

26. The device according to claim 25 wherein the light emitting member located in the polymer matrix which emits light at said at least one pre-selected wavelength is the polymer matrix itself.

27. The device according to claim 25 wherein the light emitting member located in the polymer matrix which emits light at the at least one pre-selected wavelength includes second nanocrystals encapsulated in said polymer matrix which emit light at said at least one pre-selected wavelength.

28. The device according to claim 25 wherein the pre-selected wavelength range is an infrared or visible spectral region, and wherein the at least one pre-selected wavelength is a visible wavelength but at a higher wavelength than wavelengths in said visible spectral region.

29. The device according to claim 27 wherein an areal concentration $N_1$ of said first nanocrystals is such that $N_1 a^2 \gg 1$ where a is a radius of the first nanocrystals, and wherein an areal concentration $N_2$ of the second nanocrystals is such that $N_2 b^2 \gg 1$ where b is a radius of the second nanocrystals.

30. The device according to claim 27 wherein the first nanocrystals are of a material and mean diameter, each of which is selected so that said first nanocrystals absorb light in said pre-selected wavelength range, and wherein the second nanocrystals are substantially monodisperse and are of a material and mean diameter, each of which is selected so that the nanocrystals emit light at the at least one pro-selected wavelength.

31. The device according to claim 27 wherein the first and the second nanocrystals are made of the same material, and wherein the first nanocrystals have a first pre-selected mean diameter selected so that the first nanocrystals absorb light in said pre-selected wavelength range, and wherein the second nanocrystals are substantially monodisperse and have a pre-selected mean diameter so that the second nanocrystals emit light at the at least one pre-selected wavelength.

32. The device according to claim 25 wherein the polymer matrix serves the function of allowing the electronic transport of at least one of electrons and holes.

33. The device according to claim 25 wherein the polymer matrix comprises semiconducting polymers selected from the group consisting of MEH-PPV and associated polyphenylene-vinylene derivatives, PFO and associated polyflnorine derivatives, and poly-thiophenes including P3HT and P3OT.

34. The device according to claim 25 herein the first nanocrystals are selected from the group consisting of inorganic semiconductors.

35. The device according to claim 27 wherein the second nanocrystals are selected from the group consisting of inorganic semiconductors.

36. The device according to claim 35 wherein the first and the second nanocrystals are selected from the group consisting of III-V semiconductors and IV-VI semiconductors.

37. The device according to claim 36 wherein the III-V semiconductors are InAs, and wherein the IV-VI semiconductors are selected from the group consisting of PbSe, CdS and CdSe.

38. The device according to claim 27 wherein the first and the second nanocrystals are colloidal PbS nanocrystals.

39. The device according to claim 25 wherein the polymer matrix is poly(p-phenylenevinylene) (PPV).

40. The device according to claim 25 wherein the first nanocrystals have pre-selected ligands attached to a surface of the first nanocrystals.

41. The device according to claim 27 wherein the second nanocrystals have pre-selected ligands attached to a surface of the second nanocrystals.

42. The device according to claim 41 wherein the pre-selected ligands attached to the surface of the first and the second nanocrystals are selected from the group consisting of oleate, hexylamine, octylamine, dodecylamine, octadecylamine, tri-octyl phosphine oxide and pyridine.

43. The device according to claim 42 wherein the pre-selected ligands attached to the surface of the first and the second nanocrystals are octadecylamine (C18).

44. The device according to claim 25 including a light source for illuminating the first nanocrystals, the light source emitting light at one or more pre-selected wavelengths for absorption by the first nanocrystals.

45. The device according to claim 25 wherein the nanocrystals have a core/shell structure comprising a core made of a pre-selected type of material and a shell material surrounding the core made of a different pre-selected type of material.

46. The device according to claim 45 wherein the nanocrystals with the core/shell structure are ZnS(CdSe).

47. The device according to claim 25 wherein the nanocrystals have a size in a range from about 1 to about 20 nm.

48. The device according to claim 25 wherein the nanocrystals have a size in a range from about 2 to about 10 nm.

49. The device according to claim 25 including a conducting, semiconducting or insulating layer located between the first electrode layer and the polymer matrix functioning to regulate the transport of electrons and holes into the polymer matrix.

50. A method for detecting light in a pre-selected wavelength range and converting the detected light into light of at least one pre-selected wavelength and emitting the light at said at least one pre-selected wavelength, comprising the steps of:
applying a pre-selected voltage across a polymer matrix located between first and second electrode layers, said polymer matrix containing
first nanocrystals which absorb light in a pre-selected wavelength range, and
a light emitting member that emits light at said at least one pre-selected wavelength; and
wherein at least one of said first and second electrode layers is substantially transparent to the light in the pre-selected wavelength range and the light of at said at least one pre-selected wavelength, and
wherein when the light in the pre-selected wavelength range is incident on the polymer matrix and absorbed by the first nanocrystals, a photocurrent is responsively produced when said pre-selected voltage is applied between the first and second electrode layers, and
wherein said photocurrent acts to pump the light emitting member located in the polymer matrix which responsively emits light at said at least one pre-selected wavelength.

51. The method according to claim 50 wherein said light emitting member located in the polymer matrix which emits light at said at least one pre-selected wavelength is the polymer matrix itself.

52. The method according to claim 50 wherein the light emitting member located in the polymer matrix which emits light at said at least one pre-selected wavelength includes second nanocrystals encapsulated in said polymer matrix which emits light at said at least one pre-selected wavelength.

53. The method according to claim 50 wherein the pre-selected wavelength range is an infrared or visible spectral region, and wherein the light at said at least one pre-selected wavelength is a visible wavelength but at a higher wavelength than wavelengths in said visible spectral region.

54. The method according to claim 50 wherein an areal concentration $N_1$ of said first nanocrystals respectively is such that $N_1 a^2 \gg 1$ where a is a radius of the first nanocrystals.

55. The method according to claim 52 wherein an areal concentration $N_2$ of the second nanocrystals is such that $N_2 b^2 \gg 1$ where b is a radius of the second nanocrystals.

56. The method according to claim 50 wherein the first nanocrystals are made of a material and have a size, both of which are selected so that said first nanocrystals absorb light in said pre-selected wavelength range.

57. The method according to claim 52 wherein the second nanocrystals are substantially monodisperse and are made of a material and have a size, both of which are selected so that the second nanocrystals emit light at said at least one pre-selected wavelength.

58. The method according to claim 52 wherein the second nanocrystals include two or more types of nanocrystals, wherein each type are of a material and monodisperse size, each of which is selected so that each of said types of nanocrystal emits light of pre-selected wavelengths in the visible or infrared, or combinations thereof.

59. The method according to claim 52 wherein the first and the second nanocrystals have pre-selected ligands attached to a surface of the first and the second nanocrystals.

60. The method according to claim 59 wherein the pre-selected ligands attached to the surface of the first and the second nanocrystals are selected from the group consisting of oleate, hexylamine, octylamine, dodecylarnine, octadecylamine, tri-octyl phosphine oxide, butylamine, and pyridine.

61. The method according to claim 59 wherein the pre-selected ligands attached to the surface of the first and the second nanocrystals are octadecylamine (C18).

62. A method for detecting light in a pre-selected wavelength range and converting the detected light into light of at least one pre-selected wavelength and emitting the light at said at least one pre-selected wavelength, comprising the steps of:
applying a pre-selected voltage across a structure which includes
first and second electrically conducting electrode layers, and
located between the first and second electrode layers, a first layer of first nanocrystals on said first electrode layer which absorb light in said pre-selected wavelength range, and
at least one second layer of second nanocrystals on the layer of first nanocrystals which emit light at said at least one pre-selected wavelength, and
said second electrically conducting electrode layer being located on the at least one second layer of nanocrystals;
wherein at least one of said first and second electrode layers is substantially transparent to light in the pre-selected wavelength range and light at said at least one pre-selected wavelength; and
wherein when light in said pre-selected wavelength range is incident on said first layer of first nanocrystals a photocurrent is responsively produced when a voltage is applied between said first and second electrode layers, and wherein said photocurrent acts to pump the at least one second layer of second nanocrystals which responsively emit light at said at least one pre-selected wavelength.

63. The method according to claim 62 wherein the laminate structure includes a second conducting, semiconducting or insulating layer located between the first electrically conducting electrode layer and said first layer of first nanocrystals, said first and second conducting, semiconducting or insulating layer functioning to regulate transport of electrons and holes into said first and at least one second layers of nanocrystals.

64. The method according to claim 62 wherein the pre-selected wavelength range is an infrared or visible spectral region, and wherein the at least one pre-selected wavelength is a visible wavelength but at a higher wavelength than wavelengths in said visible spectral region.

65. The method according to claim 62 wherein an areal concentration $N_1$ of said first nanocrystals respectively is such that $N_1 a^2 \gg 1$ where a is a radius of the first nanocrystals, and wherein an areal concentration $N_2$ of said second nanocrystals is such that $N_2 b^2 \gg 1$ where b is a radius of the second nanocrystals.

66. The method according to claim 62 wherein the first nanocrystals are made of a material and have a size, both of which are selected so that said first nanocrystals absorb light in said pre-selected wavelength range, and wherein the second nanocrystal are substantially monodisperse and are made of a material and have a size, both of which are selected so that the second nanocrystals emit light at the at least one pre-selected wavelength.

67. The method according to claims 62 wherein said second layer of the second nanocrystals include two or more types of nanocrystals, wherein each type are of a material and size, each of which is selected so that each type of nanocrystal emits light of pre-selected wavelengths in the visible or infrared, or combinations thereof.

68. The method according to claim 62 including a first conducting, semiconducting or insulating layer located between said first electrically conducting electrode layer and said first layer of first nanocrystals, a second conducting, semiconducting or insulating layer located between said first layer of first nanocrystals and said at least one second layer of second nanocrystals, wherein said first and second conducting, semiconducting or insulating layers function to regulate the transport of electrons and holes into the first and at least one second layers of nanocrystals.

69. The method according to claim 62 wherein the first and the second nanocrystals have pre-selected ligands attached to a surface of the first and the second nanocrystals.

70. The method according to claim 69 wherein the pre-selected ligands attached to the surface of the first and the second nanocrystals are selected from the group consisting of oleate, hexylamine, octylamine, dodecylarnine, octadecylamine, tri-octyl phosphine oxide, butylamine, and pyridine.

71. The method according to claim 69 wherein the pre-selected ligands attached to the surface of the first and the second nanocrystals are octadecylamine (C18).

* * * * *